United States Patent
Ida et al.

(10) Patent No.: US 8,999,069 B2
(45) Date of Patent: Apr. 7, 2015

(54) METHOD FOR PRODUCING CLEANING WATER FOR AN ELECTRONIC MATERIAL

(75) Inventors: Junichi Ida, Tokyo (JP); Hiroto Tokoshima, Tokyo (JP)

(73) Assignee: Kurita Water Industries Ltd., Tokyo (JP)

( * ) Notice: Subject to any disclaimer, the term of this patent is extended or adjusted under 35 U.S.C. 154(b) by 1212 days.

(21) Appl. No.: 12/736,487

(22) PCT Filed: Mar. 25, 2009

(86) PCT No.: PCT/JP2009/055902
§ 371 (c)(1),
(2), (4) Date: Oct. 13, 2010

(87) PCT Pub. No.: WO2009/128327
PCT Pub. Date: Oct. 22, 2009

(65) Prior Publication Data
US 2011/0030722 A1    Feb. 10, 2011

(30) Foreign Application Priority Data
Apr. 16, 2008  (JP) .................... 2008-106926

(51) Int. Cl.
*C11D 11/00*  (2006.01)
*C11D 7/02*   (2006.01)
*C11D 3/02*   (2006.01)
*H01L 21/02*  (2006.01)

(52) U.S. Cl.
CPC .. *C11D 7/02* (2013.01); *C11D 3/02* (2013.01);
*C11D 11/0047* (2013.01); *H01L 21/02052* (2013.01)

(58) Field of Classification Search
CPC ................... H01L 21/02052; H01L 21/67057; C11D 11/0047
USPC ............... 510/175, 176; 134/2; 257/E21.228
See application file for complete search history.

(56) References Cited

U.S. PATENT DOCUMENTS

| | | | | |
|---|---|---|---|---|
| 5,800,626 | A  * | 9/1998 | Cohen et al. | 134/1.3 |
| 6,086,057 | A  * | 7/2000 | Mitsumori et al. | 261/122.1 |
| 6,290,777 | B1 * | 9/2001 | Imaoka et al. | 134/1 |
| 2003/0094610 | A1* | 5/2003 | Aoki et al. | 257/48 |
| 2003/0136763 | A1* | 7/2003 | Nakagawa et al. | 216/83 |
| 2005/0093182 | A1* | 5/2005 | Morita et al. | 261/26 |

FOREIGN PATENT DOCUMENTS

| | | |
|---|---|---|
| JP | H10-064867 | 3/1998 |
| JP | H11-071600 | 3/1999 |
| JP | 2000-216130 | 8/2000 |
| JP | 2001-007073 | 1/2001 |
| JP | 2001-205204 | 7/2001 |
| JP | 2001-345301 A | 12/2001 |
| JP | 2006-272069 A | 10/2006 |
| JP | 2007-243113 | 9/2007 |
| JP | 2008-066460 | 3/2008 |

\* cited by examiner

*Primary Examiner* — Gregory Webb
(74) *Attorney, Agent, or Firm* — Manabu Kanesaka

(57) ABSTRACT

A method for producing cleaning water for an electronic material, includes obtaining oxygen gas and argon gas from air with a PSA oxygen concentration apparatus, dissolving the oxygen gas and argon gas obtained from the PSA oxygen concentration apparatus in pure water or ultrapure water. A concentration of dissolved oxygen is in a range of 8 to 50 mg/L, and a content of dissolved argon gas is in a range of 2 to 50 volume % of a total amount of dissolved oxygen gas and the dissolved argon gas.

3 Claims, 2 Drawing Sheets

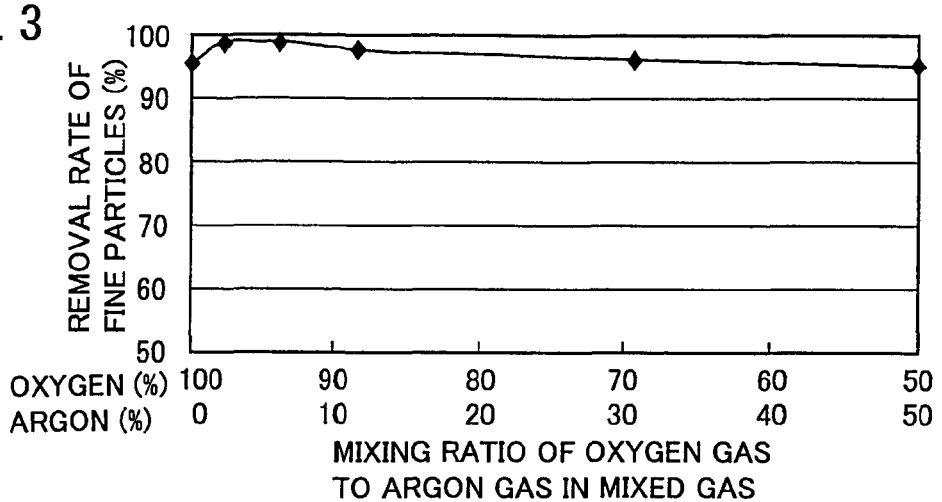
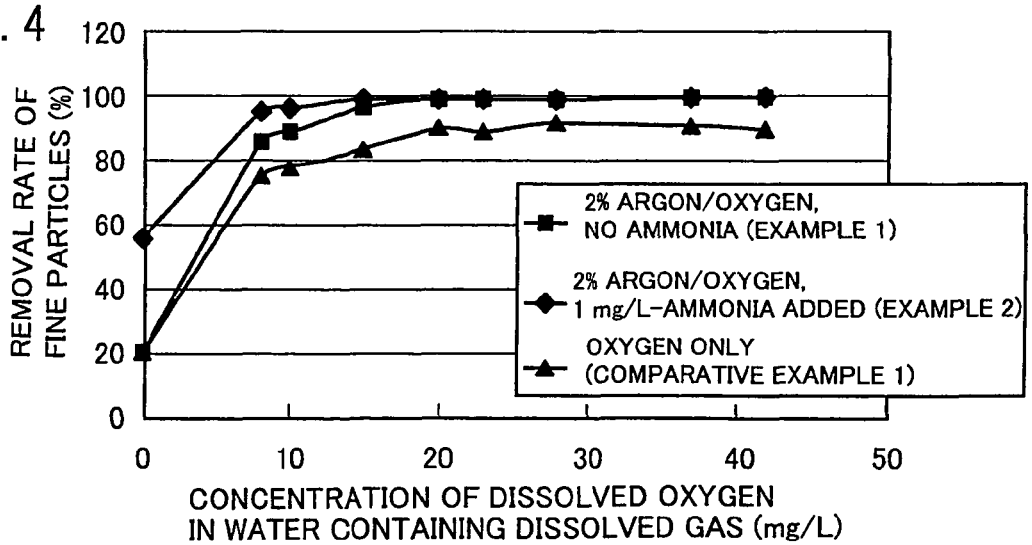

METHOD FOR PRODUCING CLEANING WATER FOR AN ELECTRONIC MATERIAL

RELATED APPLICATIONS

The present application is National Phase of International Application No. PCT/JP2009/055902 filed Mar. 25, 2009, and claims priority from Japanese Application No. 2008-106926, filed Apr. 16, 2008, the disclosure of which is hereby incorporated by reference herein in its entirety.

FIELD OF INVENTION

The present invention relates to a method for producing the cleaning water for an electronic material (an electronic part and an electronic member, and the like) such as a substrate for a semiconductor and a liquid crystal.

BACKGROUND OF INVENTION

In order to remove fine particles, organic matter, metals and the like from surfaces of electronic materials such as silicon substrates for semiconductors, glass substrates for liquid crystals, and quartz substrates for photomasks, wet cleaning at a high temperature with a hydrogen peroxide-based concentrated chemical solution, so-called RCA cleaning, has been performed. RCA cleaning is an effective method of removing metals and the like on the surfaces of electronic materials. However, as large amounts of high-concentration acids, alkalis, and hydrogen peroxide are used in RCA cleaning, such chemical solutions are contained in liquid waste that is discharged and there is a high neutralization load or precipitation treatment load in waste liquid treatment, and in addition, a large amount of sludge is produced.

Therefore, water containing dissolved gas, prepared by dissolving a particular gas in ultrapure water and adding a small amount of a chemical if needed, has become used in stead of a solution containing a high concentration of the chemical. When cleaning is performed with the water containing dissolved gas, it is less problematic in terms of residual chemicals present on objects to be cleaned, and an improved cleaning effect is obtained, therefore, the amount of cleaning water used can be reduced.

Examples of such a particular gas conventionally used for water containing dissolved gas as cleaning water for electronic materials include hydrogen gas, oxygen gas, ozone gas, noble gas and carbon dioxide gas. In particular, water containing dissolved hydrogen gas to which an infinitesimal amount of ammonia is added exhibits an excellent effect in removing fine particles when it is used in a cleaning step in which it is used in conjunction with ultrasonic waves (for example, Patent Document 1).

Even in the case where cleaning is performed with water containing dissolved gas, when an object to be cleaned is large in size, the amount of the cleaning water used increases. For example, when water containing dissolved hydrogen gas is used, the amount of hydrogen gas used increases, and therefore, the cost of safety measures increase. For this reason, water containing dissolved gas which is less expensive and exhibits an improved cleaning effect is desired for the purpose of further reducing cleaning cost as well.

[Patent Document 1] Japanese Patent Publication No. 2007-243113

SUMMARY OF INVENTION

The present invention has been made in view of the conventional actual situation described above and an object of the present invention is to provide cleaning water for an electronic material which exhibits a remarkably improved cleaning effect in comparison with conventional waters containing dissolved gas, a method for cleaning an electronic material with the cleaning water for an electronic material, and a method for producing the cleaning water for an electronic material.

Another object of the present invention is to provide a system for supplying water containing dissolved gas capable of producing the water containing dissolved gas thus described efficiently and supplying the water containing dissolved gas to a point of use.

The cleaning water for an electronic material of the present invention is for cleaning an electronic material, and contains dissolved gases comprising oxygen and argon, in which the concentration of dissolved oxygen is equal to or more than 8 mg/L, and the content of dissolved argon gas is equal to or more than 2 volume % of the total amount of dissolved oxygen gas and dissolved argon gas.

Preferably, the pH of the cleaning water for an electronic material is equal to or more than 7.

The cleaning water for an electronic material may comprise ammonia.

The method for cleaning an electronic material of the present invention is characterized in that an electronic material is cleaned with the cleaning water for an electronic material of the present invention.

The cleaning water may be used for ultrasonic cleaning of an electronic material.

In the method for producing cleaning water for an electronic material of the present invention, the cleaning water for an electronic material of the present invention described above is produced by dissolving in water oxygen gas and argon gas selected from oxygen gas from an oxygen gas tank, argon gas from an argon gas tank, and oxygen gas and argon gas taken from air with a PSA oxygen concentration apparatus.

The production method may include steps of degassing water to remove dissolved gas and subsequently dissolving the oxygen gas and the argon gas in an amount equal to or smaller than that of the removed dissolved gas.

The system for supplying water containing dissolved gases of the present invention comprises: a degasifier for degassing water to remove dissolved gas; a gas-dissolving apparatus for dissolving oxygen gas and argon gas in degassed water from the degasifier to prepare water containing dissolved gas in which the concentration of the dissolved oxygen is equal to or more than 8 mg/L, and the content of dissolved argon gas is equal to or more than 2 volume % of the total amount of dissolved oxygen gas and dissolved argon gas; and supplying means for supplying the water containing dissolved gas from the gas-dissolving apparatus to a point of use.

The degasifier may be a vacuum membrane degasifier provided with a gas permeable membrane, and the gas-dissolving apparatus may be a gas-dissolving apparatus provided with a gas permeable membrane.

Water containing dissolved oxygen/argon gas, in which the concentration of the dissolved oxygen is equal to or more than 8 mg/L and the content of the dissolved argon gas is equal to or more than 2 volume % of the total amount of dissolved oxygen gas and dissolved argon gas, has a remarkably excellent cleaning effect.

With regard to the cleaning water for an electronic material of the present invention which comprises the water containing dissolved oxygen/argon gas thus described, amounts of dissolved gases are small, and an excellent cleaning effect can be obtained even when a smaller amount of a chemical is used, and therefore, the cleaning water for an electronic material can be produced safely and easily at a low cost. With the use of the cleaning water for an electronic material, an electronic material contaminated with fine particles or the like can be cleaned with a smaller amount of the cleaning water, safely, easily and efficiently at a low cost.

In addition, the system for supplying water containing dissolved gas of the present invention makes it possible to efficiently produce such water containing dissolved gas with an excellent cleaning effect and to supply the water containing dissolved gas to a point of use.

BRIEF DESCRIPTION OF DRAWINGS

FIG. 3 is a graph showing a relation between ratios of dissolved oxygen gas/dissolved argon gas (volume percentage) in water containing dissolved gas and removal rates of fine particles by cleaning in Experimental Example 1.

FIG. 4 is a graph showing a relation between concentrations of dissolved oxygen in water containing dissolved gas and removal rates of fine particles by cleaning in Examples 1 and 2, and Comparative Example 1.

DETAILED DESCRIPTION

Figure 1:
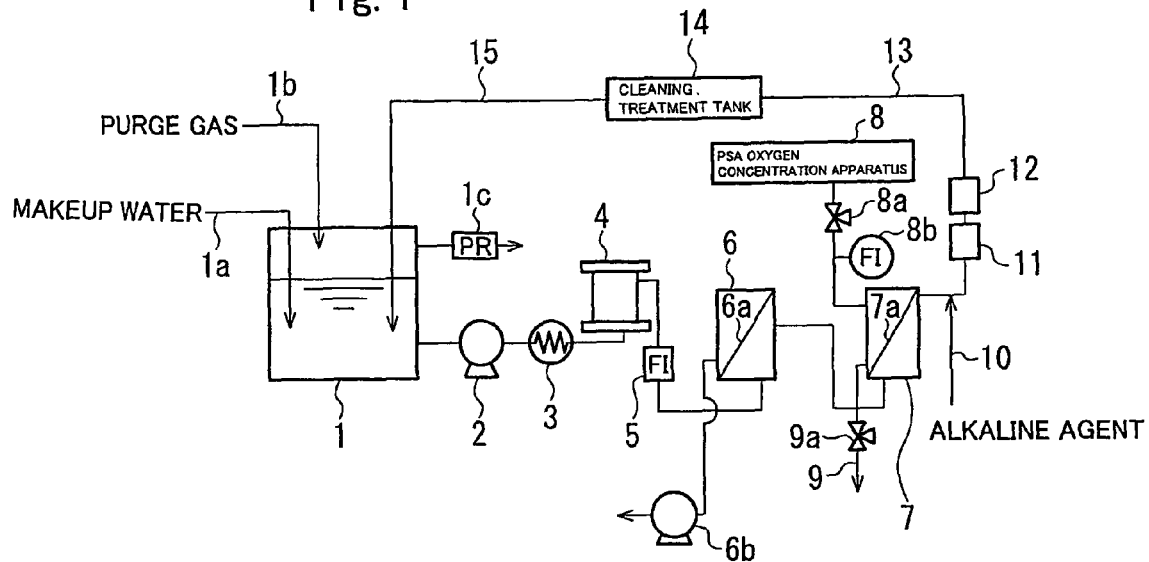
FIG. 1 is a flow diagram showing an embodiment of a system for supplying water containing dissolved gas according to the present invention.

Embodiments of the present invention will be described in detail below.

[Cleaning Water for an Electronic Material (Water Containing Dissolved Gas)]

The cleaning water for an electronic material of the present invention contains dissolved oxygen/argon gases in which the concentration of the dissolved oxygen is equal to or more than 8 mg/L and the content of the dissolved argon gas is equal to or more than 2 volume % of the total amount of dissolved oxygen gas and dissolved argon gas.

In the case where the concentration of the dissolved oxygen in the water containing dissolved gas according to the present invention is less than 8 mg/L, a sufficient cleaning effect cannot be obtained. The concentration of the dissolved oxygen is proportional to the effectiveness of the cleaning effect. However, when the concentration is very high, it causes the cleaning effect to plateau and raises the cost of preparing the water containing dissolved gas. Consequently, the concentration of the dissolved oxygen in the water containing dissolved gas as cleaning water for an electronic material is preferably 8 to 50 mg/L, particularly preferably 10 to 44 mg/L.

Further, when the amount of the dissolved argon gas in water containing dissolved gas is equal to or more than 2 volume % of the total amount of dissolved oxygen gas and dissolved argon gas, the improvement in the cleaning effect brought about by using argon gas can be securely obtained. When the percentage is less than 2 volume %, sufficient improvement in the cleaning effect cannot be obtained. However, when the amount of dissolved argon gas is excessive, the cleaning effect tends to decrease because, for example, the concentration of dissolved oxygen decreases relatively in terms of solubility of gas in water. Therefore, the percentage of the dissolved argon gas to the total amount of dissolved oxygen gas and dissolved argon gas in the water containing dissolved gas is preferably 2 to 50 volume %, and particularly preferably 2 to 40 volume %.

In the present invention, as water in which oxygen gas and argon gas are dissolved, pure water or ultrapure water can be used.

In addition, the cleaning functionality of the cleaning water for an electronic material of the present invention can be improved by further adding one or more of the following substances to the water containing dissolved oxygen/argon gases described above: alkaline agents such as ammonia, sodium hydroxide, potassium hydroxide, and tetramethylammonium hydroxide; acids such as hydrogen fluoride, hydrogen chloride, and sulfuric acid; and chemicals such as chelating agents and surface active agents. In particular, a cleaning effect on fine particles and the like can be improved by adding alkaline agents such as ammonia to adjust the pH of the water containing dissolved gas to be 7 or more, preferably 9 to 14, which means alkaline. In addition to alkaline chemicals, alkaline gases can be used for the pH adjustment. However, it is preferable to use ammonia which is easy to handle and whose concentration is easy to control. A good cleaning effect can be obtained, in particular, when using cleaning water whose pH is adjusted to be in the range of 7 to 11 by adding 1 mg/L or more of ammonia, for example, about 1 to 200 mg/L of ammonia. An excessively high pH of the cleaning water, or an excessively large amount of added ammonia is not preferable because objects to be cleaned may become damaged. Ammonia may be added either before or after the dissolution of the gases.

[Method for Cleaning Electronic Material]

The method for cleaning an electronic material of the present invention is a method in which an electronic material is cleaned with the above-described cleaning water for an electronic material of the present invention.

There is no particular limitation to the cleaning method, and any of conventionally known methods can be adopted. Examples of such methods include a method in which cleaning is performed by spraying cleaning water to an object to be cleaned, and a method in which cleaning is performed by immersing an object to be cleaned in cleaning water. Because an excellent cleaning effect can be obtained, it is particularly preferable to perform ultrasonic cleaning which includes steps of immersing an object to be cleaned in cleaning water and applying ultrasonic waves to the cleaning water in which the object to be cleaned is immersed.

Although a frequency of the ultrasonic wave used in the ultrasonic cleaning is not particularly limited, frequencies used for general cleaning, for example, 20 KHz to 3 MHz, are more preferable.

Further, with regard to a temperature of the cleaning water used for cleaning, temperatures in a range of from 10 to 90° C. can be adopted. However, with the cleaning water for an electronic material of the present invention, an excellent cleaning effect can be obtained even when the cleaning water is at a room temperature. Therefore, the temperature of the cleaning water is preferably a room temperature.

When cleaning an object to be cleaned with the cleaning water for an electronic material, it is preferable to use a closed cleaning tank or pipe because contamination of the cleaning water can be prevented and accordingly the quality of the cleaning water can be maintained at a high level for a long period of time. In such a case, for example, the cleaning water can be produced intensively in one location without requiring respective cleaning water-producing apparatuses for many cleaning machines, and the produced cleaning water can be supplied as cleaning water with stable quality through a main pipe and a branched pipe. In addition, it is possible to construct a circulation system in which excess cleaning water unused in a cleaning machine is returned to a water tank and is fed to the cleaning machine again. Further, it is possible to construct a collection-circulation system in which cleaning water once used for cleaning is collected, impurities contained therein are removed such that no problems occur in the next cleaning, the resultant cleaning water is degassed again, necessary amounts of oxygen gas and argon gas are dissolved in the degassed cleaning water, and the cleaning water thus obtained is reused for cleaning.

[Method for Producing Cleaning Water for Electronic Material]

The above-described cleaning water for an electronic material of the present invention can be produced by dissolving oxygen gas and argon gas at predetermined concentrations in pure water or ultrapure water produced according to a usual manner. In such a case, the order of dissolution of the oxygen gas and the argon gas is not particularly limited. Either one of the gases can be dissolved first and the other gas can be dissolved later, or both gases can be dissolved simultaneously. Further, the oxygen gas and the argon gas can be dissolved in pure water or ultrapure water as a mixed gas prepared by mixing the gases in a predetermined ratio in advance.

As the oxygen gas and the argon gas used for the water containing dissolved gas, oxygen gas and argon gas supplied from an oxygen gas tank and from an argon gas tank, respectively, may be used, and the oxygen gas and the argon gas may be taken from air present in the atmosphere with a PSA (Pressure Swing Adsorption) oxygen concentration apparatus and used. That is, since argon gas is also generated when oxygen gas is generated from air (oxygen concentration is about 20 volume %, argon concentration is about 1 volume %) with a PSA oxygen concentration apparatus, oxygen/argon mixed gas can be obtained. In addition, a PSA oxygen concentration apparatus and gas tanks may be used together. It is preferable to use a method in which oxygen/argon mixed gas having a predetermined argon gas concentration is produced in advance with a PSA oxygen concentration apparatus, and the mixed gas is dissolved in pure water or ultrapure water, because the method is less expensive and can save time and labor, such as replacement of gas tanks.

Further, when dissolving the oxygen gas and the argon gas, it is preferable to degas pure water or ultrapure water to remove dissolved gas in advance and to dissolve the oxygen gas and the argon gas in an amount equal to or less than that of the removed dissolved gas because smoother dissolution of the gases can be achieved.

As the degasifier in such a case, it is preferable to use a vacuum membrane degasifier which employs a gas permeable membrane module in which a gas phase and a liquid phase are separated from each other by a gas permeable membrane, and which transfers dissolved gas in the liquid phase regardless of its components to the gas phase through the gas permeable membrane by reducing the pressure of the gas phase. In addition, with regard to the subsequent dissolution of the oxygen gas and the argon gas, it is preferable to use an apparatus which employs a gas permeable membrane module and which transfers the oxygen gas and the argon gas, which has been supplied to the gas phase, to the liquid phase through the gas permeable membrane and dissolves the gases. As described above, a method which employs a gas permeable membrane module can dissolve gases in water easily, and can adjust and control concentrations of dissolved gases easily, as well.

As described before, in the case where a chemical or the like such as ammonia is added to the cleaning water, such a chemical may be added either before or after the dissolution of the oxygen gas and the argon gas. In the case where an alkaline agent such as ammonia is added to adjust the pH, injection of such an alkaline agent can be controlled easily by using a chemical-feed pump which works in conjunction with a pH meter.

[System for Supplying Water Containing Dissolved Gases]

The system for supplying water containing dissolved gases of the present invention is useful as a system for supplying water containing dissolved gases as cleaning water for an electronic material of the present invention. The system for supplying water containing dissolved gases is characterized in that it comprises: a degasifier for degassing water to remove dissolved gas; a gas-dissolving apparatus for dissolving oxygen gas and argon gas in degassed water from the degasifier to prepare water containing dissolved gas in which the concentration of the dissolved oxygen is equal to or more than 8 mg/L and the content of the dissolved argon gas is equal to or more than 2 volume % of the total amount of dissolved oxygen gas and dissolved argon gas; and supplying means for supplying the water containing dissolved gas from the gas-dissolving apparatus to a point of use.

It is preferable for the system for supplying water containing dissolved gas to further comprise the followings:

i) drained water returning means for returning at least a part of drained cleaning water used at a point of use in order to use the drained cleaning water for cleaning water.

ii) unused water containing dissolved gas returning means for returning at least a part of unused water containing dissolved gas from a point of use in order to use the unused water containing dissolved gas for cleaning water.

iii) a water tank for retaining cleaning water to be supplied to a gas-dissolving apparatus and means for introducing water from returning means to the water tank.

iv) a pump for supplying water from the water tank to the gas-dissolving apparatus.

v) means for supplying water from the pump to the gas-dissolving apparatus after the water is purified by a purifier.

vi) means for adding a chemical to at least one of circulating water and makeup water.

vii) measuring part for measuring a concentration of a chemical in water, or other such values, so as to maintain a constant concentration of the chemical in the water to which the chemical is added.

As described above, a vacuum membrane degasifier with a gas permeable membrane is preferable as the degasifier, and a gas-dissolving apparatus with a gas permeable membrane is preferable as the gas-dissolving apparatus, as well. Specifically, the gas-dissolving apparatus includes a gas-dissolving membrane module in which a gas chamber and a liquid chamber are separated from each other by a gas permeable membrane, and in the gas-dissolving apparatus, an amount of gas, which is larger than an amount of the gas which can be dissolved in an amount of water flown at that time, is supplied to the gas-dissolving membrane module in order to discharge condensed water trapped in the gas chamber of the gas-dissolving membrane module, and the gas dissolution is performed while undissolved excess portion of the supplied gas is discharged to outside the gas-dissolving membrane module.

The system for supplying water containing dissolved gas will be described below with reference to FIGS. 1 and 2.

Figure 2:
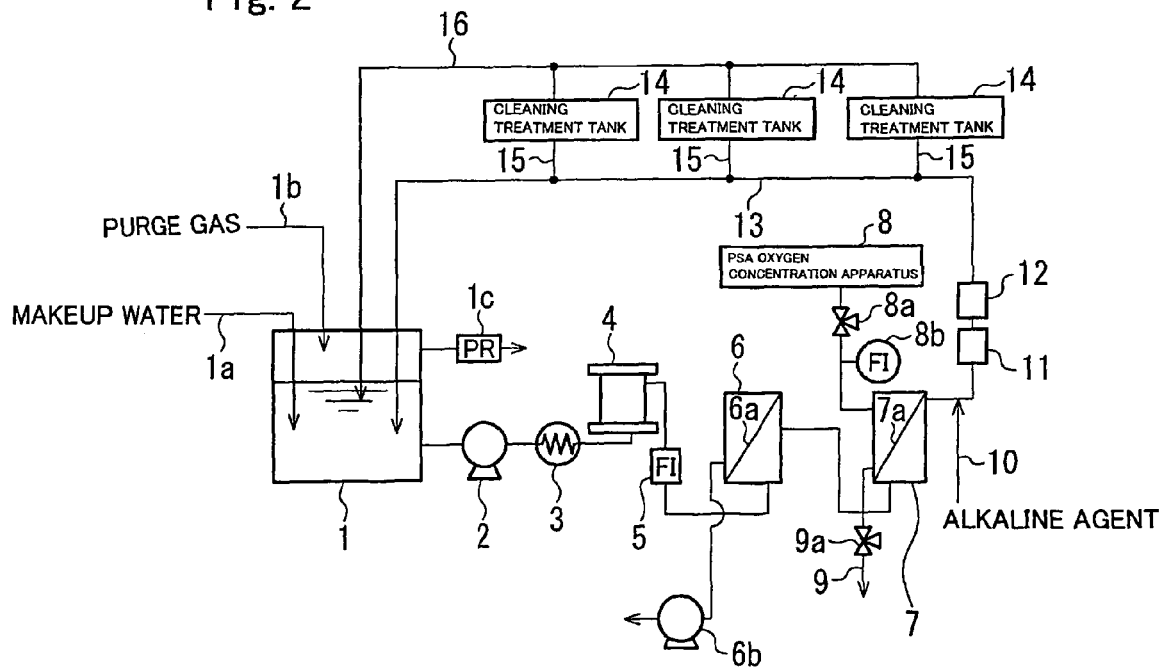
FIG. 2 is a flow diagram showing another embodiment of a system for supplying water containing dissolved gas according to the present invention.

FIGS. 1 and 2 are flow diagrams respectively showing the system for supplying water containing dissolved gas according to embodiments of the present invention.

In the system for supplying water containing dissolved gas shown in FIG. 1, drained water (drained cleaning water), obtained after an object to be cleaned is cleaned with water in which gas (oxygen/argon mixed gas) is dissolved, is returned to a reservoir tank 1 through a pipe 15, and makeup water is supplied through a makeup water pipe 1*a*. As makeup water, pure water or ultrapure water having a certain degree of cleanliness capable of being used for cleaning, or gas (oxygen/argon mixed gas)—dissolved water produced by using a separate apparatus is desirable.

In order to keep cleanliness of the reservoir tank 1, inflow of outside air may be prevented by supplying purge gas from a purge gas pipe 1*b* to adjust the pressure inside the reservoir tank 1 with a pressure adjusting mechanism 1*c* in such a way that the pressure is slightly, for example, about 10 to 50 mmAq, preferably about 30 mmAq higher than an atmospheric pressure. In the case where a high cleanliness is not required for an object to be cleaned, the purge gas is not always necessary. Further, after considering safety, the same gas as the one to be dissolved (oxygen/argon mixed gas) is preferably used as the purge gas, because diffusion of the gas from water in the reservoir tank 1 can be suppressed.

The reservoir tank 1 can be used also as a cleaning treatment tank 14 described later. In such a case, the makeup water pipe 1*a* is connected to the cleaning treatment tank 14.

Water in the reservoir tank 1 is fed to a purifier 4 through a squeeze pump 2 and a heat exchanger 3 for maintaining a water temperature constant. In the purifier 4, foreign substances present in the water that substantially affect cleaning are removed together with a part of the water.

The heat exchanger 3 is used mainly to cool the water in such a way that the temperature elevation during circulation is offset, however, the water at an elevated temperature may be used for cleaning without installing the heat exchanger. On the contrary, humidification may be performed. As to an installation site of the heat exchanger 3, upstream of the purifier 4 is desirable.

As the purifier 4, for example, an apparatus provided with an ultrafiltration (UF) membrane, a microfiltration (MF) membrane, or the like is used, and foreign substances are discharged to outside the system together with brine water.

A site for supplying makeup water may be any site between the reservoir tank 1 and a secondary side of the purifier 4. From the viewpoint that an amount of water treated with the purifier 4 is reduced to efficiently remove foreign substances, the secondary side of the purifier 4 is preferable. However, as complex control is involved in the operation of the apparatus, it is preferable to supply makeup water to the reservoir tank 1, in which makeup water is easily controlled. For example, by adjusting an amount of makeup water so as to maintain the water level in the reservoir tank 1 constant, the amount can be substantially balanced with an amount of water discharged to outside the system. Thus, control can be performed easily.

After the removal of foreign substances in water with the purifier 4, the water is fed to a degasifier 6 through a flowmeter 5. As the degasifier 6, preferable is a membrane degasifier which includes a degassing membrane 6*a*, and whose gas chamber and liquid chamber are separated from each other by the degassing membrane 6*a*. By suctioning the inside of the gas chamber with a vacuum pump 6*b*, water containing dissolved gas is degassed. It is desirable to perform suction from the lower end of the gas chamber in order to achieve smooth discharge of condensed water in the gas chamber. There is no limitation for the vacuum pump 6*b*, and water seal pumps and scroll pumps are used. However, as to pumps using oil for generating vacuum, back-diffusion of oil may occur to contaminate a degassing membrane. For this reason, oil-less pumps are desirable.

The degassed water from the degassing apparatus 6 is fed to a gas-dissolving apparatus 7. As the gas-dissolving apparatus 7, preferable is a gas-dissolving membrane module in which a gas chamber and a liquid chamber are separated from each other by a gas permeable membrane 7*a*. In the system shown in FIG. 1, oxygen/argon mixed gas is introduced from a PSA oxygen concentration apparatus 8 to the gas chamber of the gas-dissolving apparatus 7 through a regulating valve 8*a* and a flowmeter 8*b*. The oxygen/argon mixed gas passes through the membrane 7*a* and dissolves in water in the liquid chamber. Excess oxygen/argon mixed gas is discharged to outside the system from a gas exhaust line 9 provided with a gas exhaust valve 9*a*.

In the case where, in order to discharge condensed water trapped in the gas chamber of the gas-dissolving membrane module, an amount of gas, which is larger than an amount of the gas which can be dissolved in an amount of the water, is supplied to the dissolving membrane module, and the gas dissolution is performed while undissolved excess portion of the supplied gas is discharged from the lower end of the membrane module as an atmosphere opening, it is preferable to open the gas exhaust valve 9*a* and perform a gas dissolving operation while discharging a part of the gas from the exhaust line 9. When an amount of the gas saturated in the water amount and the water temperature is set at 1, a supply amount of the gas in the above case is desirably about 1.1 to 1.5, and is preferably about 1.2 to 1.4 from economical viewpoint and dischargeability. It is desirable to adjust the concentration of the dissolved gas by changing the concentration of the supplied gas.

The gas may also be dissolved with the gas exhaust valve 9*a* closed. In such a case, oxygen/argon mixed gas is supplied from the PSA oxygen concentration apparatus 8 in an amount in accordance with a water amount measured by the flowmeter 5 and a required concentration. The flow rate of the oxygen/argon mixed gas is measured by a gas flowmeter 8*b*, and the gas flow rate is adjusted by the regulating valve 8*a* in such a way that a value indicated by the flowmeter 8*b* becomes a desired value. A mass flow controller, in which a flowmeter and a regulating valve are configured integrally, may be used. In addition, an amount of the oxygen/argon mixed gas may be adjusted to be a desired value indicated in conjunction with the value indicated by a dissolved gas concentration meter 12.

The water containing dissolved gas from the gas-dissolving apparatus 7 is subsequently confirmed with a pH meter 11 that its pH is in a predetermined range and further confirmed with the dissolved gas concentration meter 12 that the concentration of dissolved oxygen is a desired concentration. Then, the water containing dissolved gas is supplied to the cleaning treatment tank 14 through a supply pipe 13.

In order to improve a cleaning effect, it is also possible to add chemicals such as alkaline agents to the water containing dissolved gas with addition means 10. A concentration of the added chemical is measured with a concentration meter, a pH meter, an ORP meter, a conductivity meter and the like for each chemical, and a supply amount of the chemical is adjusted in such a way that a desired concentration is achieved. Examples of an adjustment method are as follows. In the case where a pump is used for injection, adjustment can be performed through the number of pulses and length of strokes, and in the case where a gas is used for injection, the injection amount can be adjusted by adjusting the gas pressure. In either method, an injection amount can be adjusted by the opening of the valve, as well. A desirable injection site is, but not limited to, immediately in front of, or a little upstream of a concentration meter (in FIG. 1, a pH meter) in order to achieve better controllability (faster response) in injection. Chemicals such as alkaline agents may be added to makeup water.

The drained cleaning water from the cleaning treatment tank 14 is returned to the reservoir tank 1 through a returning pipe 15.

In FIG. 1, a whole amount of water containing dissolved gas from the gas-dissolving apparatus 7 is fed to the cleaning treatment tank 14 through the supply pipe 13. In FIG. 2, however, a terminal end of the supply pipe 13 is connected to the reservoir tank 1, there disposed a branched supply pipe 15 branched from the middle of the supply pipe 13, and the water containing dissolved gas is supplied to each cleaning treatment tank 14 from the branched supply pipe 15.

The drained cleaning water from each cleaning treatment tank 14 is returned to the reservoir tank 1 through a pipe 16. The excess water containing dissolved gas unused for cleaning is also returned to the reservoir tank 1, and this unused water is reused as raw water for the water containing dissolved gas.

EXAMPLES

The present invention will be described more specifically with Experimental Example, Examples, and Comparative Example.

The water containing dissolved gas as cleaning water for an electronic material used in the below description was prepared as follows: degassed water was prepared in advance by removing dissolved gas in pure water with a vacuum membrane degasifier provided with a gas permeable membrane in such a way that the dissolved gas was adjusted to be equal to or less than 10% of saturation; and a necessary amount of oxygen/argon mixed gas containing oxygen gas or argon gas produced from air in the atmosphere with a PSA oxygen concentration apparatus was dissolved in the degassed water with a gas permeable membrane module for gas dissolution. The temperature of the cleaning water was an room temperature (23° C.)

As an object to be cleaned, a substrate prepared by drying a silicon wafer substrate contaminated with a cerium oxide polishing material was used. As a cleaning machine, an ultrasonic batch cleaning machine (ultrasonic frequency: 750 KHz) was used. In all cases, cleaning time was set to be 3 minutes.

The cleaning effect was evaluated by measuring the number of fine particles having a particle size equal to or larger than 0.12 μm on the substrate before and after the cleaning with the defect inspection apparatus manufactured by Topcon, "WM-1500", and calculating a removal rate.

Experimental Example 1

Water containing dissolved gas was prepared by dissolving in degassed water oxygen gas or oxygen/argon mixed gas produced with a PSA oxygen concentration apparatus in such a way that a degree of saturation of total amount of the dissolved gas is adjusted to be constant at 38% (16 mg/L as a concentration of the dissolved oxygen), and the cleaning effect of each water containing dissolved gas was examined.

Relation between mixing ratios of oxygen/argon in the gas dissolved in the degassed water (shown by volume percentage of each gas based on the mixed gas as a whole, which is set at 100 volume %) and removal rates of fine particles by the cleaning is shown in FIG. 3. In all waters containing dissolved gas, the pH was 7.

As is clear from FIG. 3, an improved cleaning effect can be obtained when using the water containing dissolved oxygen/argon gas containing dissolved argon gas than when using the water containing dissolved gas in which an amount of dissolved argon gas is 0% and a concentration of dissolved oxygen is 16 mg/L.

Examples 1 and 2, and Comparative Example 1

The cleaning effect of each water containing dissolved gas was examined in a same manner as in Experimental Example 1 except that the followings were used as the waters containing dissolved gas. The results are shown in FIG. 4.

Example 1 waters containing dissolved gas (pH 7) prepared as follows; oxygen/argon mixed gas containing 2 volume % of argon gas (argon gas concentration in the mixed gas is 2 volume %) was obtained with a PSA oxygen concentration apparatus, and the oxygen/argon mixed gas was dissolved in degassed water in such a way that waters containing dissolved gas having various concentrations of the dissolved oxygen could be obtained.

Example 2 preparations (pH 9.4) obtained by respectively adding 1 mg/L of ammonia to the waters containing dissolved gas having various concentrations of the dissolved oxygen in Example 1.

Comparative Example 1 waters containing dissolved gas (pH 7) prepared by dissolving oxygen gas containing no argon gas in degassed water in such a way that waters containing dissolved gas having various concentrations of the dissolved oxygen could be obtained.

According to FIG. 4 which exhibits the relation between concentrations of the dissolved oxygen in the waters, containing dissolved gas and removal rates of the fine particles, it is shown that the water containing dissolved oxygen/argon mixed gas containing dissolved argon gas exhibits an improved cleaning effect than the water containing dissolved oxygen gas containing no dissolved argon gas, and that a still more excellent cleaning effect can be obtained by further adding ammonia to the water containing dissolved oxygen/argon gas to make the pH thereof slightly alkaline.

In each case, the improvement of the cleaning effect was obtained when the concentration of the dissolved oxygen was equal to or more than 8 mg/L, and therefore, it is shown that a preferable concentration of the dissolved oxygen is equal to or more than 8 mg/L.

Though the present invention has been described in detail with the use of particular embodiments, it will be apparent to a person skilled in the art that various modifications can be made without departing from the spirit and the scope of the present invention.

The present application is based on the Japanese paten application (Japanese Patent Application No. 2008-106926) filed on Apr. 16, 2008, the entirety of which is incorporated by citation.

The invention claimed is:

1. A method for producing cleaning water for an electronic material, comprising:
   obtaining oxygen gas and argon gas from air with a PSA oxygen concentration apparatus, dissolving the oxygen gas and argon gas obtained from the PSA oxygen concentration apparatus in pure water or ultrapure water, wherein a concentration of dissolved oxygen is in a range of 8 to 50 mg/L; and a content of dissolved argon gas is in a range of 2 to 50 volume % of a total amount of dissolved oxygen gas and the dissolved argon gas.

2. The method for producing cleaning water for an electronic material according to claim 1, further comprising degassing the pure water or the ultrapure water to remove dissolved gas and subsequently dissolving the oxygen gas and the argon gas in an amount equal to or less than that of the dissolved gas removed.

3. The method for producing cleaning water for an electronic material according to claim 1, wherein the concentration of the dissolved oxygen is 10 to 44 mg/L; and the content of the dissolved argon gas is 2 to 40 volume % of the total amount of the dissolved oxygen gas and the dissolved argon gas.

* * * * *